(12) United States Patent
Furukawa

(10) Patent No.: US 10,236,430 B2
(45) Date of Patent: Mar. 19, 2019

(54) THERMOELECTRIC MODULE

(71) Applicant: KYOCERA Corporation, Kyoto-shi, Kyoto (JP)

(72) Inventor: Tomohiro Furukawa, Kirishima (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 15/735,790

(22) PCT Filed: May 26, 2016

(86) PCT No.: PCT/JP2016/065569
§ 371 (c)(1),
(2) Date: Dec. 12, 2017

(87) PCT Pub. No.: WO2017/056549
PCT Pub. Date: Apr. 6, 2017

(65) Prior Publication Data
US 2018/0175269 A1 Jun. 21, 2018

(30) Foreign Application Priority Data
Sep. 28, 2015 (JP) ................................. 2015-189897

(51) Int. Cl.
*H01L 35/32* (2006.01)
*H01L 35/10* (2006.01)
(Continued)

(52) U.S. Cl.
CPC .............. *H01L 35/10* (2013.01); *H01L 35/02* (2013.01); *H01L 35/32* (2013.01); *H02N 11/00* (2013.01)

(58) Field of Classification Search
CPC ............................. H01L 35/35; H01L 35/325
See application file for complete search history.

(56) References Cited

U.S. PATENT DOCUMENTS 5,168,339 A * 12/1992 Yokotani .................. H01L 35/12
136/203
2003/0193087 A1* 10/2003 Hayashi .................. H01L 35/10
257/712
(Continued)

FOREIGN PATENT DOCUMENTS

JP 05-020353 U 3/1993
JP 2008-244239 A 10/2008
(Continued)

OTHER PUBLICATIONS

International Search Report, PCT/JP2016/065569, dated Aug. 16, 2016, 2 pgs.

*Primary Examiner* — Eric R Smith
(74) *Attorney, Agent, or Firm* — Volpe and Koenig, P.C.

(57) ABSTRACT

A thermoelectric module includes a pair of support substrates having mutually opposed regions; wiring conductors each disposed on one principal surfaces of the pair of support substrates, the one principal surfaces being opposed to each other; a plurality of thermoelectric elements disposed between the one principal surfaces; a lead member joined to one wiring conductor disposed on one support substrate; and a cover material which covers a junction where the lead member is joined to the one wiring conductor disposed on the one support substrate. The one support substrate has a first protruding portion including the junction, and the other support substrate has a second protruding portion located so as not to overlap the junction as seen in a direction perpendicular to the one principal surface. The cover material is joined to the first protruding portion and the second protruding portion.

5 Claims, 4 Drawing Sheets

(51) Int. Cl.
    *H01L 35/02* (2006.01)
    *H02N 11/00* (2006.01)

(56) References Cited

U.S. PATENT DOCUMENTS

2010/0252084  A1  10/2010  Konishi
2011/0259385  A1  10/2011  Hiroyama

FOREIGN PATENT DOCUMENTS

JP    2009-129968 A    6/2009
JP    2010-165840 A    7/2010

* cited by examiner

THERMOELECTRIC MODULE

TECHNICAL FIELD

The present invention relates to a thermoelectric module for use in temperature adjustment, more particularly, temperature adjustment for automotive seat coolers, fuel cells, etc.

BACKGROUND ART

In a thermoelectric module, the supply of electric power to a thermoelectric element can produces a difference in temperature between one principal surface and the other principal surface. Besides, in a thermoelectric module, upon a difference in temperature between one principal surface and the other principal surface, electric power can be generated by the thermoelectric element. Taking advantage of these properties, the thermoelectric module is used for temperature adjustment or thermoelectric power generation, or the like.

As such a thermoelectric module, there is known one comprising: a pair of support substrates; a plurality of thermoelectric elements; a wiring conductor which connects the plurality of thermoelectric elements; a lead member for power supply; and a cover material which covers a junction of the lead member (refers to Patent Literature 1, for example).

CITATION LIST

Patent Literature

Patent Literature 1: Japanese Unexamined Patent Publication JP-A 2008-244239

SUMMARY OF INVENTION

Solution to Problem

A thermoelectric module according to the present disclosure comprises: a pair of support substrates having mutually opposed regions; wiring conductors each disposed on one principal surfaces of the pair of support substrates, the one principal surfaces being opposed to each other; a plurality of thermoelectric elements disposed between the one principal surfaces of the pair of support substrates; a lead member joined to one wiring conductor of the wiring conductors which is disposed on one support substrate of the pair of support substrates; and a cover material which covers a junction where the lead member is joined to the one wiring conductor disposed on the one support substrate, the one support substrate having a first protruding portion including the junction, the other support substrate of the pair of support substrates having a second protruding portion located so as not to overlap the junction as seen in a direction perpendicular to the one principal surface, the cover material being joined to the first protruding portion and the second protruding portion.

DESCRIPTION OF EMBODIMENTS

Description will now be made in detail of a thermoelectric module in accordance with a present embodiment with reference to drawings.

Figure 1:
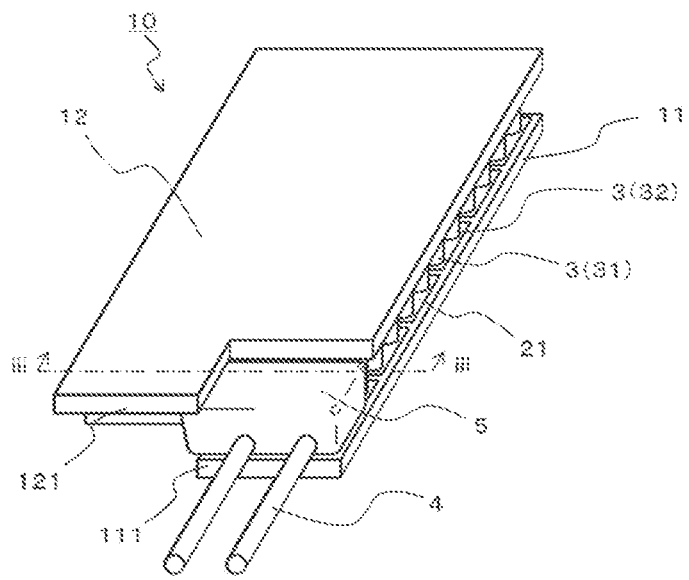
FIG. 1 is a schematic perspective view of an example of a thermoelectric module.
Figure 2A:
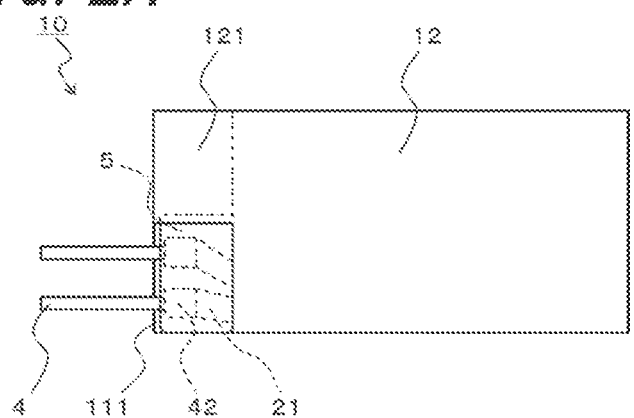
FIG. 2A is a schematic plan view of the thermoelectric module shown in FIG. 1 in a partially see-through manner.
Figure 2B:
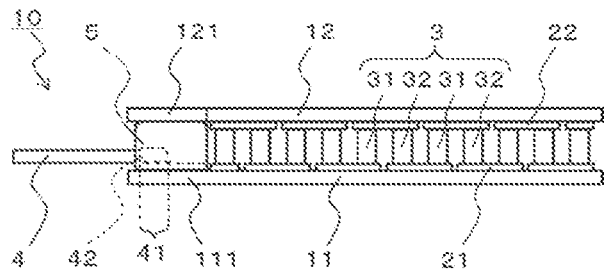
FIG. 2B is a schematic side view of the thermoelectric module shown in FIG. 1 in a partially see-through manner.

FIG. 1 is a schematic perspective view of one example of a thermoelectric module. Moreover, FIG. 2A is a schematic plan view of the thermoelectric module shown in FIG. 1 in a partially see-through manner, and FIG. 2B is a schematic side view of the thermoelectric module shown in FIG. 1 in a partially see-through manner. Furthermore, FIG. 3 is a schematic sectional view of the thermoelectric module taken along the line iii-iii shown in FIG. 1.

Figure 3:
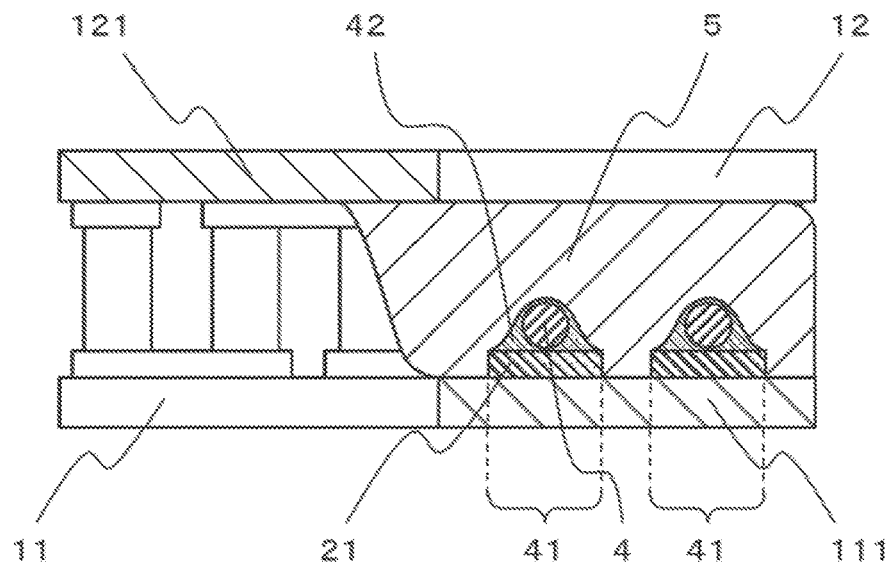
FIG. 3 is a schematic sectional view of the thermoelectric module taken along the line iii-iii shown in FIG. 1.

The thermoelectric module 10 shown in FIGS. 1 to 3 comprises: a first support substrate 11 and a second support substrate 12 having mutually opposed regions, which will hereafter be also referred to simply as "paired support substrates" in the explanation common to both support substrates; wiring conductors 21 and 22 each disposed on one principal surfaces of the paired support substrates 11 and 12, the one principal surfaces being opposed to each other; a plurality of thermoelectric elements 3 disposed between the one principal surfaces of the paired support substrates 11 and 12; a lead member 4 joined to the wiring conductor 21 disposed on one support substrate 11 of the paired support substrates 11 and 12; and a cover material 5 which covers a junction 41 where the lead member 4 is joined to the wiring conductor 21 disposed on the one support substrate 11. Moreover, the one support substrate 11 has a first protruding portion 111 including the junction 41 of the lead member 4, and, the other support substrate 12 has a second protruding portion 121 located so as not to overlap the junction 41 of the lead member 4 as seen in a direction perpendicular to one principal surface. The cover material 5 is joined to the first protruding portion 111 and the second protruding portion 121.

In the thermoelectric module 10 according to this embodiment, the plurality of thermoelectric elements 3 are supported between the first support substrate 11 and the second support substrate 12 in a sandwiched manner. The first support substrate 11 and the second support substrate 12, exclusive of the first protruding portion 111 and the second protruding portion 121 which will be described hereafter, have mutually opposed regions of, for example, rectangular shape. For example, the rectangular opposed regions may be set to be 40 to 50 mm in longitudinal dimension, 20 to 30 mm in transverse dimension, and 0.25 to 0.35 mm in thickness in a plan view.

The first support substrate 11 is placed so that an upper surface thereof becomes one principal surface opposed to the second support substrate 12, and, the second support substrate is placed so that a lower surface thereof becomes one principal surface opposed to the first support substrate 11.

The first support substrate 11 bears the wiring conductor 21 on the upper surface thereof, wherefore at least the upper-surface side of the first support substrate 11 is made of an insulating material. As the first support substrate 11, for example, it is possible to use a substrate in which a copper sheet for external heat transmission or heat dissipation is attached to a lower surface of a sheet of alumina filler-added epoxy resin or a sheet of ceramic such as aluminum oxide sintered body or aluminum nitride sintered body. As another example, it is possible to use a substrate in which an insulating layer made for example of epoxy resin, polyimide resin, alumina ceramics, or aluminum nitride ceramics is disposed on an upper surface of a copper sheet, a silver sheet, or a silver-palladium sheet.

Moreover, the second support substrate 12 bears the wiring conductor 22 on a lower surface thereof, wherefore at least the lower-surface side of the second support substrate 12 is made of an insulating material. A member similar to the above-described member used for the first support substrate 11 may be used as the second support substrate 12, and the second support substrate 12 may be placed symmetrically with respect to the first support substrate 11.

The opposed one principal surfaces of the paired support substrates 11 and 12 are provided with the wiring conductors 21 and 22, respectively. The wiring conductors 21 and 22 electrically connect the plurality of thermoelectric elements 3 and the lead member 4. For example, the wiring conductor 21 and 22 may be obtained by attaching a copper sheet to each of the opposed one principal surfaces of the support substrates 11 and 12, masking part of the copper sheet which becomes the wiring conductors 21 and 22, and removing a region other than the masked region by etching. In the alternative, the wiring conductors 21 and 22 may be obtained by attaching a copper sheet punched in the form of the wiring conductors 21 and 22 to each of the first support substrate 11 and the second support substrate 12. The material constituting the wiring conductors 21 and 22 is not limited to copper, but may be, for example, silver or a silver-palladium material.

The plurality of thermoelectric elements 3 are disposed between the one principal surfaces of the paired support substrates 11 and 12. The thermoelectric element 3 is a member for effecting temperature adjustment under the Peltier effect, or effecting power generation under the Seebeck effect. The plurality of thermoelectric elements 3 are disposed in the form of a matrix of rows and columns at a spacing which equals 0.5 to 2 times the diameter of the thermoelectric element 3, while being joined to the wiring conductors 21 and 22 via non-illustrated solder. More specifically, p-type thermoelectric elements 31 and n-type thermoelectric elements 32 are alternately disposed adjacent to each other so as to be electrically connected to each other in series via the wiring conductors 21 and 22 and the solder, so that all the thermoelectric elements 3 are connected together in series.

As described above, the thermoelectric elements 3 are classified as the p-type thermoelectric element 31 and the n-type thermoelectric element 32. The body portion of the thermoelectric element 3 is composed of a thermoelectric material made of $A_2B_3$ crystal (A represents Bi and/or Sb, and B represents Te and/or Se), or, preferably, a Bi (bismuth) and Te (tellurium)-based thermoelectric material. More specifically, the p-type thermoelectric element 31 is composed of a thermoelectric material made of a solid solution of $Bi_2Te_3$ (bismuth telluride) and $Sb_2Te_3$ (antimony telluride). Moreover, the n-type thermoelectric element 32 is composed of a thermoelectric material made of a solid solution of $Bi_2Te_3$ (bismuth telluride) and $Sb_2Se_3$ (antimony selenide).

Here, the thermoelectric material constituting the p-type thermoelectric element 31 is obtained by rendering a p-type material made of bismuth, antimony, and tellurium which is solidified after having been melted one time into a rod-like form by unidirectional solidification using Bridgman method. Moreover, the thermoelectric material constituting the n-type thermoelectric element 32 is obtained by rendering an n-type material made of bismuth, tellurium, and selenium which is solidified after having been melted one time into a rod-like form by unidirectional solidification using Bridgman method.

After applying a resist coating to the side surface of each rod-like thermoelectric material to prevent adhesion of plating, the material is cut in a thickness of, for example, 0.3 to 5 mm with use of a wire saw. Then, a nickel layer and a tin layer are sequentially formed only on the cut surface by means of electrolytic plating. Lastly, the resist is removed by a dissolving solution, whereupon the thermoelectric element 3 (the p-type thermoelectric element 31 and the n-type thermoelectric element 32) can be obtained.

For example, the thermoelectric element 3 may be shaped in a circular cylinder, a quadrangular prism, or a polygonal prism. The thermoelectric element 3 is preferably given the shape of a circular cylinder, in particular. This makes it possible to reduce the influence of thermal stress developed in the thermoelectric element 3 under heat cycles. In the case of shaping the thermoelectric element 3 in a circular cylinder, for example, its diameter falls in the range of 1 to 3 mm, and its height falls in the range of 0.3 to 5 mm.

Around the plurality of thermoelectric elements 3 disposed between the first support substrate 11 and the second support substrate 12, a sealing material 6 made of resin such for example as silicone resin or epoxy resin may be disposed on an as needed basis. Although the outer periphery of the configuration is deformed to a large extent due to a difference in temperature between the paired support substrates 11 and 12, by placing the sealing material 6 so as to fill a gap which is provided between the plurality of outer periphery-side thermoelectric elements 3 disposed between the one principal surfaces of the paired support substrates 11 and 12, the sealing material 6 serves as a reinforcement material and it is possible to restrain separation between the thermoelectric element 3 and the support substrates 11 and 12.

The lead member 4 is joined to the wiring conductor 21 disposed on one support substrate 11 of the paired support substrates 11 and 12. The lead member 4 is a member for providing electric power to the thermoelectric element 3, or for taking out electric power produced by the thermoelectric element 3. The wiring conductor 21 and the lead member 4 are joined together by a joining material 42 such for examples as solder. Note that, instead of soldering, laser beam welding may be adopted for the joining of the wiring conductor 21 and the lead member 4. In this case, a melted part resulting from welding process corresponds to the joining material 42.

Moreover, the cover material 5 is provided so as to cover the junction 41 of the lead member 4 with the one support substrate 11. As employed herein, the junction 41 refers to a part provided with the joining material 42 for the joining of the lead member 4. The cover material 5 covers an area ranging from a periphery of the joining material 42 to an upper surface of the joining material 42 including part of the lead member 4. The cover material 5 serves as a reinforcement material for restraining the lead member 4 from becoming detached from the wiring conductor 21. As the cover material 5, resin such for example as silicone resin or epoxy resin can be used. A thickness of the cover material 5 may be adjusted to be nearly equal to a spacing between the paired support substrates 11 and 12, and to a height (length) of the thermoelectric element 3.

The first support substrate 11 has the first protruding portion 111 including the junction 41 of the lead member 4, and the second support substrate 12 has the second protruding portion 121 located so as not to overlap the junction 41 of the lead member 4 as seen in a direction perpendicular to one principal surface, and, the cover material 5 is joined to the first protruding portion 111 and the second protruding portion 121.

Here, the first protruding portion 111 is 1 to 5 mm, for example, in protruding amount (protruding distance), and is 5 to 30 mm, for example, in width along the side of the first support substrate 11. The first protruding portion 111 may be formed so as to protrude from the entire side of the first support substrate 11. Moreover, the second protruding portion 121 is 1 to 5 mm, for example, in protruding amount (protruding distance), and is 5 to 25 mm, for example, in width along the side of the second support substrate 12.

For example, given that the junction 41 of the lead member 4 lies between the opposed regions of the paired support substrates, when the first support substrate 11 is subjected to low temperature and the second support substrate 12 is subjected to high temperature in use, then heat is transmitted from the second support substrate 12 to the joining material 42 immediately below through the cover material 5 with consequent thermal expansion of the joining material 42, which may result in detachment of the joining material 42 due to a difference in thermal expansion from the first support substrate 11 in low-temperature condition.

On the other hand, in the case where the first support substrate 11 has the first protruding portion 111, and the junction 41 of the lead member 4 lies on the first protruding portion 111 positioned outside a region of the first support substrate 11 opposed to the second support substrate 12, in contrast to the case where the joining material 42 for the joining of the lead member 4 and the cover material 5 which covers the joining material 42 lie on the opposed region of the first support substrate 11, it can be made less susceptible to the influence of heat. Moreover, since a region above the junction 41 of the lead member 4 is open, the joining material 42 for the joining of the lead member 4 and the cover material 5 which covers the joining material 42 are less susceptible to the influence of heat present in the opposed region of the second support substrate 12. That is, by positioning the second protruding portion 121 which will be described hereafter so as to leave a region above the junction of the lead member 4 open, it is possible to minimize the influence of heat exerted on the junction 41 of the lead member 4.

Moreover, the cover material 5 is joined to the first protruding portion 111 as well as to the second protruding portion 121 so that deformation of the cover material 5 is restrained by the first protruding portion 111 and the second protruding portion 121.

Accordingly, this arrangement makes it possible to reduce a decrease in the strength of connection between the cover material 5 covering the junction 41 of the lead member 4 and the support substrates 11 and 12 under a stress induced by heat for example, and thereby restrain detachment of the lead member 4, with consequent attainment of a highly durable thermoelectric module.

Each of the first protruding portion 111 and the second protruding portion 121 may be made in a rectangular form, a trapezoidal form, or a form with rounded corners, in a plan view.

Figure 4:
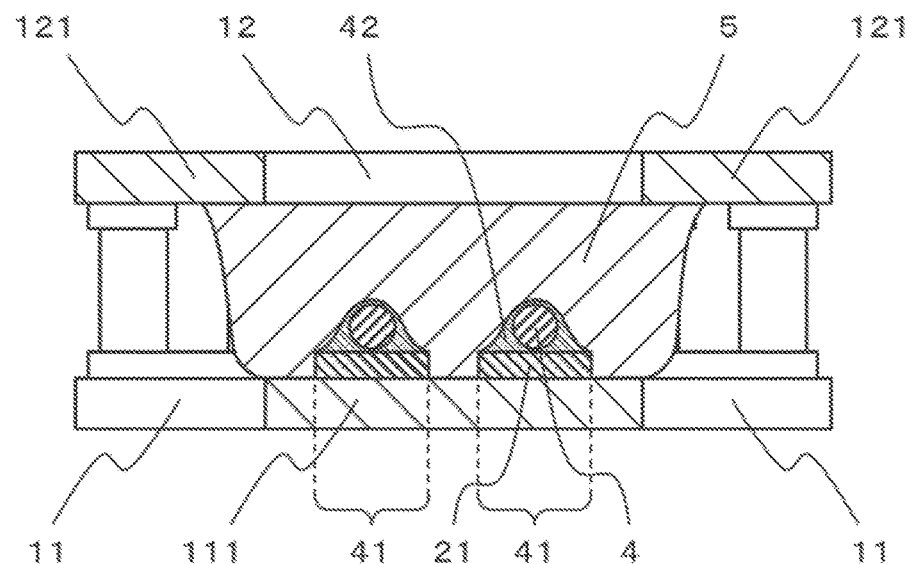
FIG. 4 is a schematic sectional view of another example of the thermoelectric module.

FIG. 4 is a schematic sectional view of another example of the thermoelectric module. As shown in FIG. 4, it is preferable to provide a pair of second protruding portions 121 on each side of the junction 41 of the lead member 4 as seen in a direction perpendicular to one principal surface. In the example shown in FIG. 4, the second protruding portions 121 are each located so as not to overlap the junction 41 of the lead member 4, and also located so as not to overlap the first protruding portion 111, as seen in a direction perpendicular to one principal surface. In this case, the first protruding portion 111 is 1 to 5 mm, for example, in protruding amount (protruding distance), and is 5 to 30 mm, for example, in width along the side of the first support substrate 11. Moreover, the second protruding portion 121 is 1 to 5 mm, for example, in protruding amount (protruding distance), and is 5 to 15 mm, for example, in width along the side of the second support substrate 12.

This arrangement makes it possible to increase the area of contact between the cover material 5 and the paired support substrates 11 and 12, as well as to restrain deformation of the cover material 5 more securely by the first protruding portion 111 and the second protruding portion 121, and thereby restrain detachment of the lead member 4 more successfully, with consequent attainment of a highly durable thermoelectric module.

Figure 5A:
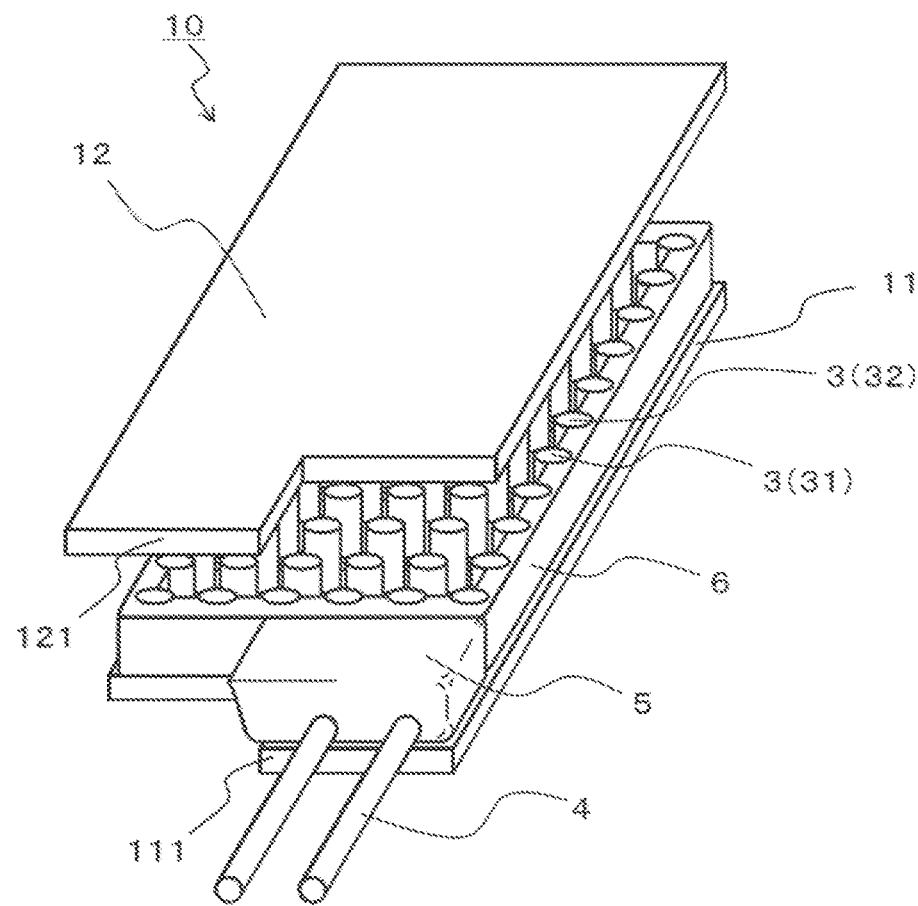
FIG. 5A is an exploded perspective view of another example of the thermoelectric module.
Figure 5B:
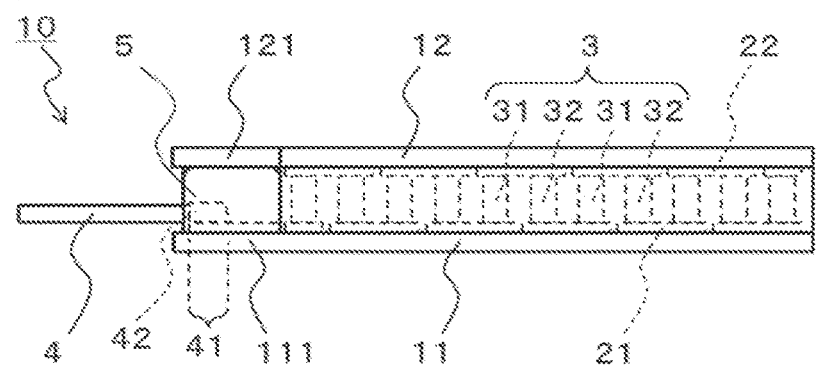
FIG. 5B is a schematic side view of the thermoelectric module shown in FIG. 5A in a partially see-through manner.

FIG. 5A is an exploded perspective view of another example of the thermoelectric module, and FIG. 5B is a schematic side view of the thermoelectric module shown in FIG. 5A in a partially see-through manner. In FIG. 5A, a state where the second support substrate 12 is detached is shown. In the case where the thermoelectric module comprises the sealing material 6 disposed between the one principal surfaces of the paired support substrates 11 and 12 so as to fill the gap which is provided between the plurality of outer periphery-side thermoelectric elements 3, the cover material 5 may be joined to the sealing material 6. This makes it possible to restrain detachment of the lead member 4 more securely, and thereby achieve further enhancement in durability.

Here, it is advisable that the cover material 5 and the sealing material 6 contain the same component as a primary constituent. This makes it possible to restrain separation between the cover material 5 and the sealing material 6, and thereby enhance the durability of the thermoelectric module. Rather than being entirely composed of the same primary constituent as that constituting the cover material 5, the sealing material 6 may be configured so that at least part thereof contacted by the cover material 5 is composed of the same primary constituent. As employed herein, the primary constituent refers to a component which is present in highest amounts in each material. As the primary constituent of the sealing material 6, resin such as epoxy resin or silicone resin can be used. More preferably, the cover material 5 and the sealing material 6 are made of the same resin from the standpoint of greater adhesion strength.

Moreover, for example, for the purpose of changing thermal conductivity, as a secondary constituent, a ceramic material such as alumina or aluminum nitride may be added, as a filler, to the cover material 5 and the sealing material 6, and also, for the purpose of changing viscosity, dry silica or polyethylene powder may be added as a thickener. Also in the case of adding such a filler or thickener, by designing the cover material 5 and the sealing material 6 to contain the same filler or thickener material in the same proportion, it is possible to render the cover material 5 and the sealing material substantially equal in coefficient of thermal expansion (coefficient of contraction).

Figure 6A:
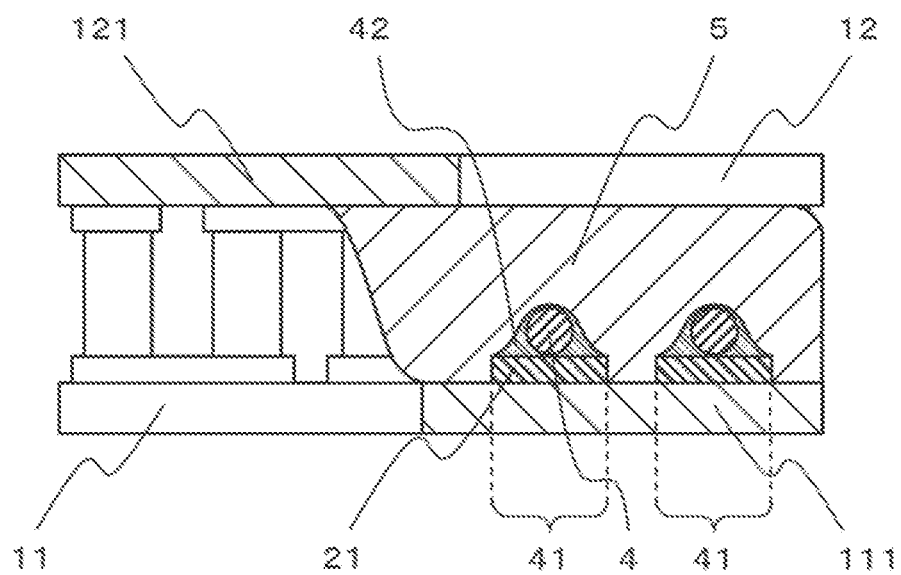
FIGS. 6A and 6B are each a schematic sectional view of another example of the thermoelectric module.
Figure 6B:
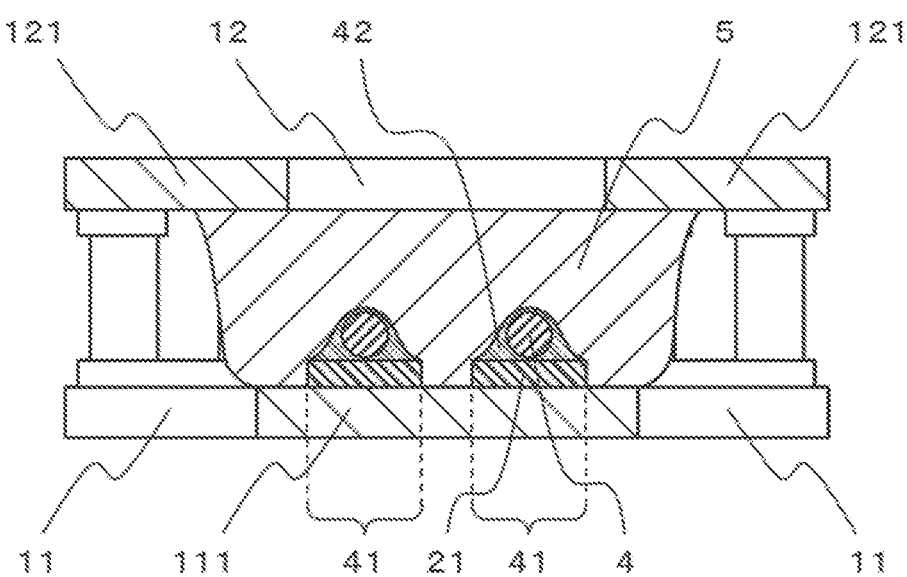

FIGS. 6A and 6B are each a schematic sectional view of another example of the thermoelectric module. As shown in FIGS. 6A and 6B, it is preferable part of the first protruding portion 111 and part of the second protruding portion 121 are located so as to overlap each other as seen in a direction perpendicular to one principal surface. In FIG. 6A, there is shown the case of providing a single second protruding portion 121, and, in FIG. 6B, there is shown the case of providing a pair of second protruding portions 121 on each side of the junction 41 of the lead member 4. This arrangement makes it possible to achieve further increase in the area of contact between the cover material 5 and the paired support substrates 11 and 12, as well as to hold the cover material 5 more firmly by the first protruding portion 111 and the second protruding portion 121, and thereby restrain detachment of the lead member 4 more successfully, with consequent attainment of a highly durable thermoelectric module.

EXAMPLES

The following describes examples.

To begin with, p-type and n-type thermoelectric materials made of Bi, Sb, Te, and Se were melted and solidified by Bridgman method to prepare 1.5 mm-diameter rod-like materials each having a circular sectional profile. More specifically, the p-type thermoelectric material was prepared from a solid solution of $Bi_2Te_3$ (bismuth telluride) and $Sb_2Te_3$ (antimony telluride), and the n-type thermoelectric material was prepared from a solid solution of $Bi_2Te_3$ (bismuth telluride) and $Bi_2Se_3$ (bismuth selenide). As surface roughening treatment, surfaces of the rod-like p-type and n-type thermoelectric materials were etched with nitric acid.

Next, each of the rod-like p-type and n-type thermoelectric materials were cut so that a height (thickness) thereof becomes 1.6 mm by a wire saw to obtain an n-type thermoelectric element and a p-type thermoelectric element. A nickel layer was formed on the cut surfaces of the thereby obtained p-type thermoelectric element and n-type thermoelectric element by electrolytic plating.

Next, with use of a both principal-surface copper-clad substrate obtained by contacting a 105 μm-thick copper sheet with each side of alumina filler-added epoxy resin under pressure, each of the first support substrate and the second support substrate (with 40 mm-square opposed regions) was prepared by etching one principal surface of the substrate to define a wiring conductor of desired wiring pattern. At this time, as to each of the first support substrate and the second support substrate, three different substrate samples were prepared, namely Sample No. 1 having a structure as shown in FIG. 3, Sample No. 2 having a structure as shown in FIG. 4, and Sample No. 3 free of the first and second protruding portions, with a lead member bonded so as to lie between the opposed regions of the support substrates. In Sample No. 1, the first protruding portion was 3 mm in protruding amount and 20 mm in width, and the second protruding portion was 3 mm in protruding amount and 20 mm in width. Moreover, in Sample No. 2, the first protruding portion was 3 mm in protruding amount and 14 mm in width, and the two second protruding portions were each 3 mm in protruding amount and 8 mm in width.

Next, a solder paste was printed at a desired location on the wiring conductor, and, on this solder paste, 127 p-type thermoelectric elements and 127 n-type thermoelectric elements were arranged so as to establish electrical series connection by a mounter. The thereby obtained arrangement of the p-type thermoelectric elements and the n-type thermoelectric elements was held between the first support substrate and the second support substrate, and, the assembly was heated in a reflow furnace, with upper and lower surfaces thereof subjected to pressure, so that the wiring conductor and the thermoelectric element were soldered to each other.

Next, a silicone resin-made sealing material was applied to the exterior of an arrangement of the plurality of outer periphery-side thermoelectric elements lying between the first support substrate and the second support substrate by an air dispenser.

In the thermoelectric module so obtained, two lead members for the passage of electric current were each joined to the wiring conductor located on the first protruding portion by soldering iron.

Next, thermosetting epoxy resin was applied so as to cover the junction of the lead member by an air dispenser, and then the construction was heated in a drying machine to cure the epoxy resin.

As an endurance test, in each thermoelectric module thus obtained, a thermally conductive grease was applied to surfaces of the first support substrate and the second support substrate, and, after being set on a heat sink adjusted to 75° C., the thermoelectric module was supplied with power at 60 W to cause a temperature difference, and, reversals of current-carrying direction were effected at intervals of 30 seconds. Following the completion of 10000 cycles of the endurance test, the presence of detachment of the lead member was checked under binocular stereo microscope at 10-fold magnification. Moreover, resistance values as obtained before and after the endurance test were measured by a four-terminal AC resistance meter to calculate a rate of resistance changes.

As a result, in the thermoelectric module of Sample No. 3 as a comparative example, detachment of the lead member was observed, and, the rate of resistance changes before and after the endurance test was as high as 38.5%. On the other hand, in the thermoelectric module of Sample No. 1 as an example, there was no detachment of the lead member, and, the rate of resistance changes in the thermoelectric module before and after the endurance test was as low as 3.8%. Moreover, as a more satisfactory result, in the thermoelectric module of Sample No. 2 as an example, there was no detachment of the lead member, and, the rate of resistance changes in the thermoelectric module before and after the endurance test was only 2.4%, which is lower than that of Sample No. 1. It will thus be seen that the thermoelectric module according to this embodiment is capable of restraining detachment of the lead member and hence excels in durability.

REFERENCE SIGNS LIST

10: Thermoelectric module
11: First support substrate
12: Second support substrate
21, 22: Wiring conductor
3: Thermoelectric element
31: P-type thermoelectric element
32: N-type thermoelectric element
4: Lead member 41: Junction
42: Joining material
5: Cover material
6: Sealing material

The invention claimed is:

1. A thermoelectric module, comprising:
a pair of support substrates having mutually opposed regions;
wiring conductors each disposed on one principal surfaces of the pair of support substrates, the one principal surfaces being opposed to each other;
a plurality of thermoelectric elements disposed between the one principal surfaces of the pair of support substrates;
a lead member joined to one wiring conductor of the wiring conductors which is disposed on one support substrate of the pair of support substrates;
a cover material which covers a junction where the lead member is joined to the one wiring conductor disposed on the one support substrate, the one support substrate having a first protruding portion including the junction and the other support substrate of the pair of support substrates having a second protruding portion located so as not to overlap the junction as seen in a direction perpendicular to the one principal surface of the other support substrate;
the first protruding portion extending away from one region of the one support substrate that opposes the other support substrate in a protruding direction, the first protruding portion having a reduced width in a direction crossing the protruding direction compared to a width of the one region;
the second protruding portion extending away from an other region of the other support substrate that opposes the one support substrate in the protruding direction, the second protruding portion having a reduced width compared to a width of the other region; and
the cover material being joined to the first protruding portion and the second protruding portion.

2. The thermoelectric module according to claim 1,
wherein the second protruding portion is provided on each side of the junction as seen in the direction perpendicular to the one principal surface so as to form a pair with each other.

3. The thermoelectric module according to claim 1, further comprising:
a sealing material disposed between the one principal surfaces of the pair of support substrates so as to fill a gap which is provided between outer periphery-side thermoelectric elements of the plurality of thermoelectric elements,
wherein the cover material is also joined to the sealing material.

4. The thermoelectric module according to claim 3,
wherein the cover material and the sealing material contain a same component as a primary constituent.

5. The thermoelectric module according to claim 1,
wherein part of the first protruding portion and part of the second protruding portion are located so as to overlap each other as seen in the direction perpendicular to the one principal surface.

* * * * *